United States Patent
Leizerovich et al.

(10) Patent No.: US 7,164,893 B2
(45) Date of Patent: Jan. 16, 2007

(54) METHOD AND APPARATUS FOR OPTIMIZING SUPPLY MODULATION IN A TRANSMITTER

(75) Inventors: Gustavo D. Leizerovich, Aventura, FL (US); Mark A. Goldberg, Plantation, FL (US)

(73) Assignee: Motorola, Inc., Schaumburg, IL (US)

( * ) Notice: Subject to any disclaimer, the term of this patent is extended or adjusted under 35 U.S.C. 154(b) by 721 days.

(21) Appl. No.: 09/944,569

(22) Filed: Aug. 31, 2001

(65) Prior Publication Data

US 2003/0045238 A1 Mar. 6, 2003

(51) Int. Cl.
*H04B 1/04* (2006.01)

(52) U.S. Cl. .................. 455/127.1; 455/126; 330/278; 330/75; 330/10

(58) Field of Classification Search ................ 330/129, 330/149, 278, 75, 10; 455/126, 127.1
See application file for complete search history.

(56) References Cited

U.S. PATENT DOCUMENTS 5,066,923 A * 11/1991 Gailus et al. ............... 330/107
5,847,602 A * 12/1998 Su ............................... 330/10
6,052,568 A * 4/2000 Williams ................... 455/126

* cited by examiner

*Primary Examiner*—Duc M. Nguyen
*Assistant Examiner*—Aung T. Win
(74) *Attorney, Agent, or Firm*—Scott M. Garrett

(57) ABSTRACT

A transmitter (200) has a compression detector for sensing the level of compression (110) in a signal that is being transmitted. The transmitter also has a radio frequency power amplifier (RFPA) (414) that is supplied by a supply modulator (426). The supply modulator provides a dynamic supply bias to the RFPA to maintain a desired amount of compression in the signal being transmitted. The supply modulator is responsive to a modulation signal (207) created by substantially following the envelope (214) of the signal to be transmitted (212). However, various signal and operational conditions can occur which cause the compression level to deviate (506) from the desired level. To maintain the desired compression level, the compression detector provides an output that is used to adjust the modulation signal from following the envelope of the signal to be transmitted in an unadjusted manner.

18 Claims, 3 Drawing Sheets

METHOD AND APPARATUS FOR OPTIMIZING SUPPLY MODULATION IN A TRANSMITTER

TECHNICAL FIELD

This invention relates in general to radio frequency transmitters, and in particular to linear transmitters using supply modulation.

BACKGROUND OF THE INVENTION

The mobile communications market is very competitive, and manufacturers strive to produce mobile communication devices with better, easier to use features, as well as improving operation and performance of these devices. One aspect of mobile communication device operation that is considered a key marketing feature is the so called "talk time." This is the amount of time the mobile communication device can operate while transmitting before the battery needs to be changed or recharged. Generally, while a mobile communication device is transmitting, it uses substantially more power than in an idle state. That is, while the user of the device is engaged in a call, the device requires more power than when it is not engaged in a call. Accordingly, increasing the efficiency of the transmitter can result in significant increases in talk time.

Transmitter design is driven by the type of communications, or the air interface for which the mobile communication device will be used, and more specifically the type of modulation used. Some systems use linear modulation to reduce the bandwidth needed for channels. While bandwidth efficiency is an advantage of linear modulation, amplifier efficiency is a significant concern. In a typical transmitter using a radio frequency power amplifier having a fixed power supply voltage, as the input signal magnitude drops, so does the efficiency. The best efficiency is achieved when the RFPA is operating near saturation.

To keep the amplifier operating near saturation, some amplifier schemes us an envelope tracking scheme to modulate the voltage supplied to the RFPA in correspondence with the envelope of the signal being transmitted. To prevent starvation of the amplifier, some margin is designed into the scheme. However, adding margin to the supply voltage is less than ideal because it reduces average efficiency. At the same time, not having the margin will often cause distortion in the amplified signal because of unexpected gain compression. Therefore there is a need for means by which the supply voltage an be modulated without the worry of compression distortion, while maintaining optimum efficiency.

DETAILED DESCRIPTION OF A PREFERRED EMBODIMENTS

Figure 1:
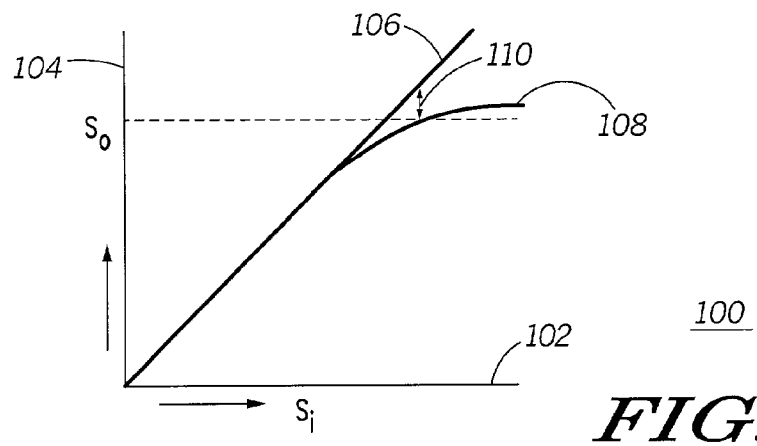
FIG. 1 shows a graph of linear amplifier operation versus ideal operation.

While the specification concludes with claims defining the features of the invention that are regarded as novel, it is believed that the invention will be better understood from a consideration of the following description in conjunction with the drawing figures, in which like reference numerals are carried forward. A brief description of the prior art is also thought to be useful.

The invention solves the problem by providing a modulated power supply for supplying voltage to the RFPA, and also detecting or sensing gain compression in the transmitter. The power supply reference signal is adjusted to eliminate distortion caused by unexpected deviations in the compression level in the transmitter. This allows the power supply to operate with less margin, thereby increasing efficiency while avoiding distortion. FIG. 1 shows a graph chart 100 which illustrates the effect of amplifier compression. The graph shows the signal strength at the input of the transmitter, $S_i$, 102 versus an output signal $S_o$, 104. In an ideal linear amplifier the relationship would be a straight line 106. However, as the output voltage approaches the supply voltage, the output deviates from the ideal, as can be seen on line 108. As the difference between the ideal and the actual begins increasing, as at 110, the resulting distortion causes an undesirable amount of information loss. Generally, an amount of compression exceeding 1 decibel (dB) is considered excessive. The invention permits the compression level to be optimized by maintaining a desired amount of compression. By maintaining a desired amount of compression, the RFPA operates at peak efficiency while excess distortion is avoided.

Figure 2:
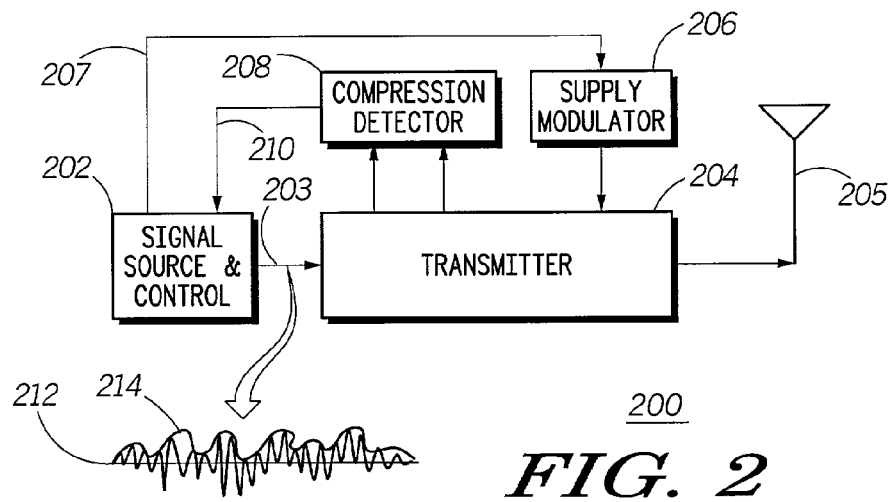
FIG. 2 shows a general block diagram of transmitter in accordance with the invention.

Referring now to FIG. 2, there is shown a block diagram 200 of a general transmitter including a means for detecting compression. A signal source and control block 202 includes control means for acquiring and processing a signal, such as a voice signal in a mobile communication device. The signal source provides a signal or signals, such as quadrature I and Q signals, to be transmitted on line 203 to the transmitter 204. The transmitter provides modulation, filtering, and radio frequency (RF) power amplification, and provides a modulated RF signal to an antenna 205. To increase the efficiency of the RF power amplifier (RFPA) in the transmitter, a supply modulator 206 provides and control the power supplied to the RFPA component of the transmitter. Typically the supply modulator controls the voltage level provided to the RFPA to maintain efficiency as the input signal varies in amplitude. The supply modulator is responsive to a modulation signal on line 207 which is supplied by the signal source and control block 202. The supply modulator adjusts its output level to track the modulation signal. A compression detector 208 senses the state of the signal to be transmitted at different stages of the transmitter, and generates a compression feedback signal if there is a condition in which deviation from an optimum compression level would occur if the supply level provided to the RFPA by the supply modulator is not adjusted. The different stages may be at the input and output of an amplifier, or at a raw signal and a corrected signal that results by adding feedback to the raw signal. The compression feedback signal is fed back to the signal source and control block on line 210.

To generate the modulation signal provided to the supply modulator, the signal source and control means evaluates the signal to be transmitted 212, and determines an envelope 214 of the signal. The envelope that is determined may not be a precise duplication of the actual envelope of the signal, and only needs to substantially correspond to the actual envelope. For example the envelope that is determined may be a band limited envelope as taught in U.S. Pat. No. 6,141,541, titled "Method, Device, Phone and Base Station For Providing Envelope Following For Variable Envelope Radio Frequency Signals," assigned to the assignee of the present invention. The modulation signal substantially tracks the envelope 214. The envelope may be determined via either analog or digital means, as is known in the art. However, occasionally a signal condition may arise such that, even though the supply level is modulated in correspondence with the envelope of the signal, due to variations in the design over temperature, or because of component variations in manufacturing, an excess compression condition will still occur and distort the signal, causing information loss, if left uncorrected. To avoid such a situation, the compression detector 208 detects this condition, sends the appropriate signal to the signal source and control, and the signal source and control block adjusts the modulation signal, causing the supply modulator to adjust the level supplied to the RFPA, thus maintaining the desired optimum compression level.

Figure 3:
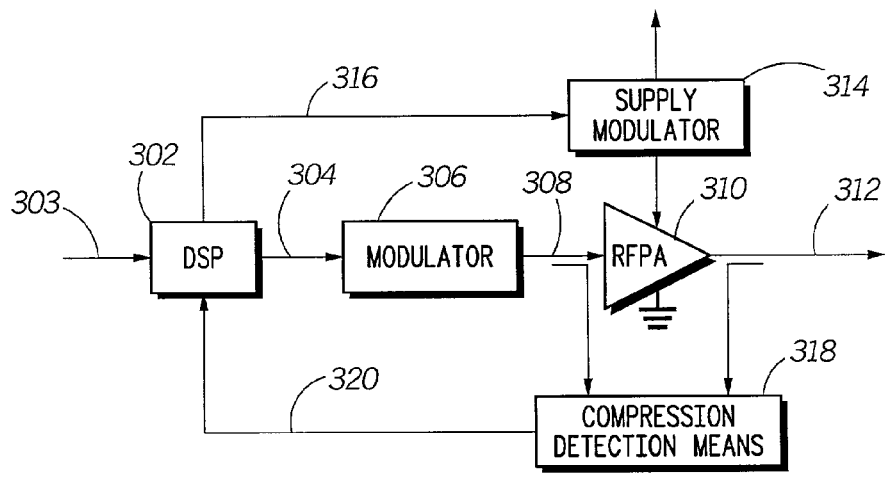
FIG. 3 shows a first embodiment of a transmitter in accordance with the invention.

Referring now to FIG. 3, there is shown a first embodiment of a transmitter 300 in accordance with the invention. The transmitter shown here substantially follows the general operation of that described hereinabove in regard to FIG. 2. A digital signal processor (DSP) 302 provides the signal source and control function. The DSP receives a signal to be transmitted 303, such as a voice signal. The DSP evaluates and operates on the signal to perform whatever operations are necessary or desired, such as generation of quadrature I and Q signals, filtering, voice encoding, and so on. The result of this processing is a signal or signals on line 304 that is provided to a modulator 306. The modulator generates a low power RF signal according to a modulation scheme on line 308, which is fed to the RFPA 310. The RFPA amplifies the signal, providing an amplified signal on line 312, which is fed to an antenna, typically. The RFPA is powered by the supply modulator 314, which is responsive to a modulation signal on line 316 provided by the DSP. A compression sensing circuit, or means for detecting compression 318 samples the low level RF signal on line 308 and the amplified RF signal on line 312. The compression detection means 318 provides a signal to the DSP on line 320. If the signal indicates a deviation from the optimum compression level may occur, the DSP adjusts the modulation signal 316, causing the supply modulator to adjust the supply level fed to the RFPA. In a control loop, the compression sensing circuit provides feedback such that the DSP can adjust the modulation signal and substantially avoid compression.

Figure 4:
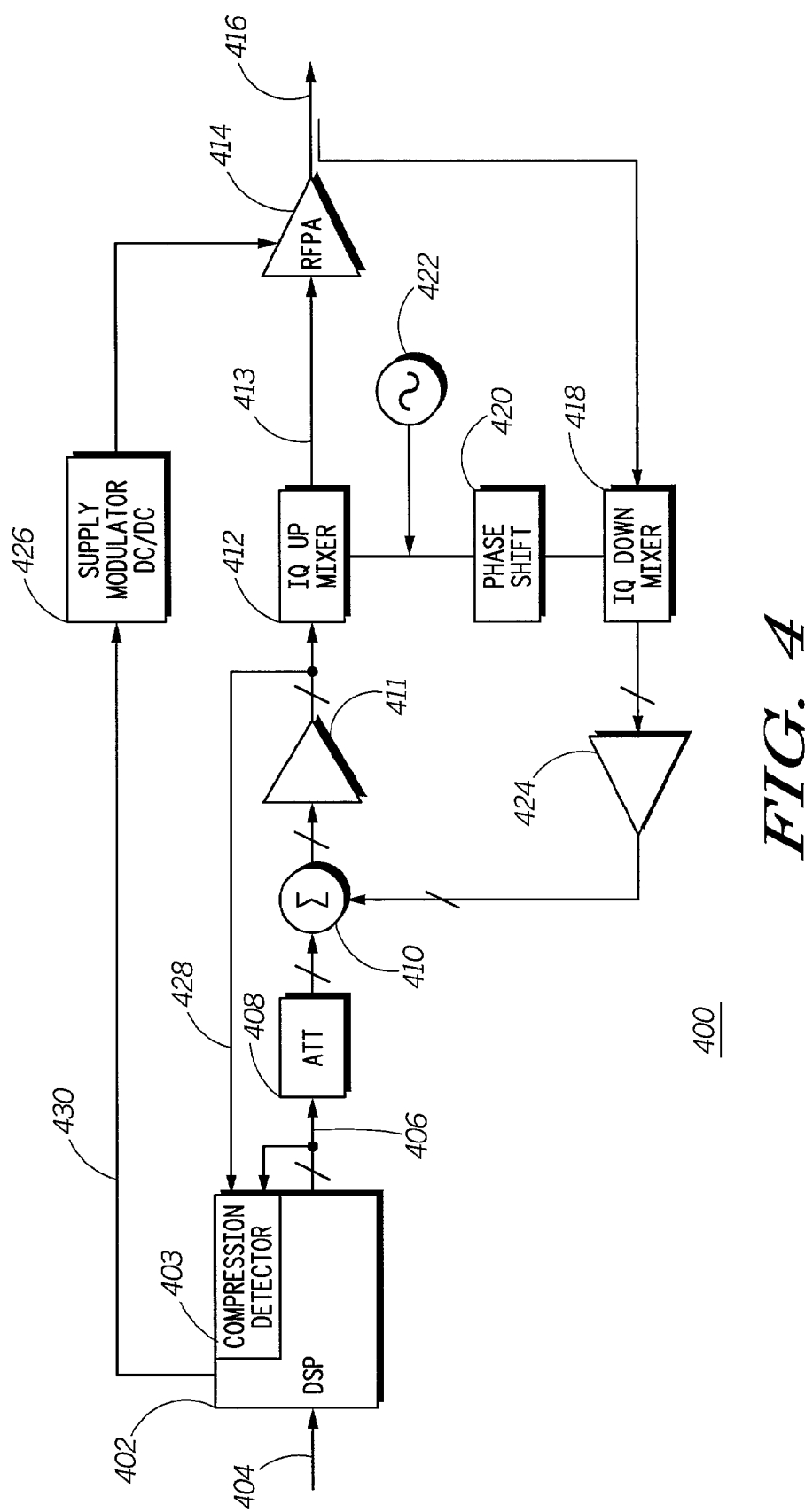
FIG. 4 shows a second embodiment of a transmitter in accordance with the invention.

Referring now to FIG. 4, there is shown a second embodiment 400 of a transmitter in accordance with the invention. Similarly to the transmitters laid out in FIGS. 2 and 3, the transmitter here is provided with a DSP 402 which includes instruction code means for implementing the compression detection function 403. The DSP receives a signal to be transmitted 404, which can be an analog or digital sampled signal. Here the DSP generates reference I and Q quadrature baseband signals on line 406. This line is shown as being sampled by the compression detection means 403, but this sampling actually takes place within the DSP, and is merely emphasized here. The reference I and Q baseband signals may be attenuated by an attenuator 408, which may be a passive or active attenuator, and may be implemented in the DSP block. The reference baseband signals are fed to a summer 410, which sums the baseband signals from the DSP with those from a feed back loop. The summed baseband signals are amplified by a first baseband amplifier 411, and then fed to a modulator such as an IQ up mixer 412, which creates a low power RF signal according to a modulation scheme. The low level RF signal is provided to an RFPA 414 on line 413. The RFPA amplifies the signal for transmission, and feeds the amplified signal on line 416 to an antenna, or another transmission medium.

The transmitter shown here uses feedback to linearize the signal to be transmitted. In the preferred embodiment Cartesian feedback is utilized. An example of Cartesian feedback is taught in U.S. Pat. No. 5,066,923 titled "Linear Transmitter Training Method and Apparatus," assigned to the assignee of the present invention. To provide Cartesian feedback, the output of the RFPA is sampled by an IQ down mixer 418. The down mixer obtains quadrature signals I' and Q' from the output of the RFPA, and feeds them to a second baseband amplifier 424. The up and down mixers preferable share a local oscillator 422, with the oscillator signal being phase shifted by a phase shifter 420 before being supplied to the down mixer 418. The I' and Q' signals are amplified and fed back to the summer 410 where they are summed with the I and Q signals. The RFPA power supply level is modulated by a supply modulator 426, such as a fast acting DC to DC converter. Such converters are known in the art, and provide an output corresponding to a reference signal, such as a modulation signal provided by the DSP on line 430.

In prior art systems the feedback loop and the supply modulation have been separate and distinct. An example of such prior art systems is embodied in U.S. Pat. No. 5,420,536 titled "Linearized Power Amplifier." In prior art systems the DSP simply generates a modulation signal that follows or tracks the envelope of the signal to be transmitted. Those systems, however, do not consider the effect of feedback on the signal prior to the RFPA. This feedback will often lead to a deviation from the desired optimum compression level in some situations. Therefore, in order to sense compression in the present embodiment, the effect of the linearization feedback is sensed by sampling the signal after the first baseband amplifier 411, and feeding it back to the compression detector over line 428. Therefore the feedback loop and the supply modulation loop are not separate and distinct.

The compression detection or sensing is accomplished here by sensing the I and Q signals and comparing them to the summed results, I+I' and Q+Q' after baseband amplification. The compression detection function can compare the expected signal with the actual signal, and can sample at the point before the baseband amplifier as well, instead of after it as shown. The expected signal level can be determined, for example, by calculation, or by mapping such as with a look-up table. If excess compression is imminent, the signal at the output of baseband amplifier 411 will actually increase due to the effects of Cartesian feedback. If this comparison indicates a deviation from an optimum compression level would occur upon RF amplification, the DSP can adjust the modulation signal on line 430, deviating it from autonomous correspondence with the envelope of the signal being transmitted.

Figure 5:
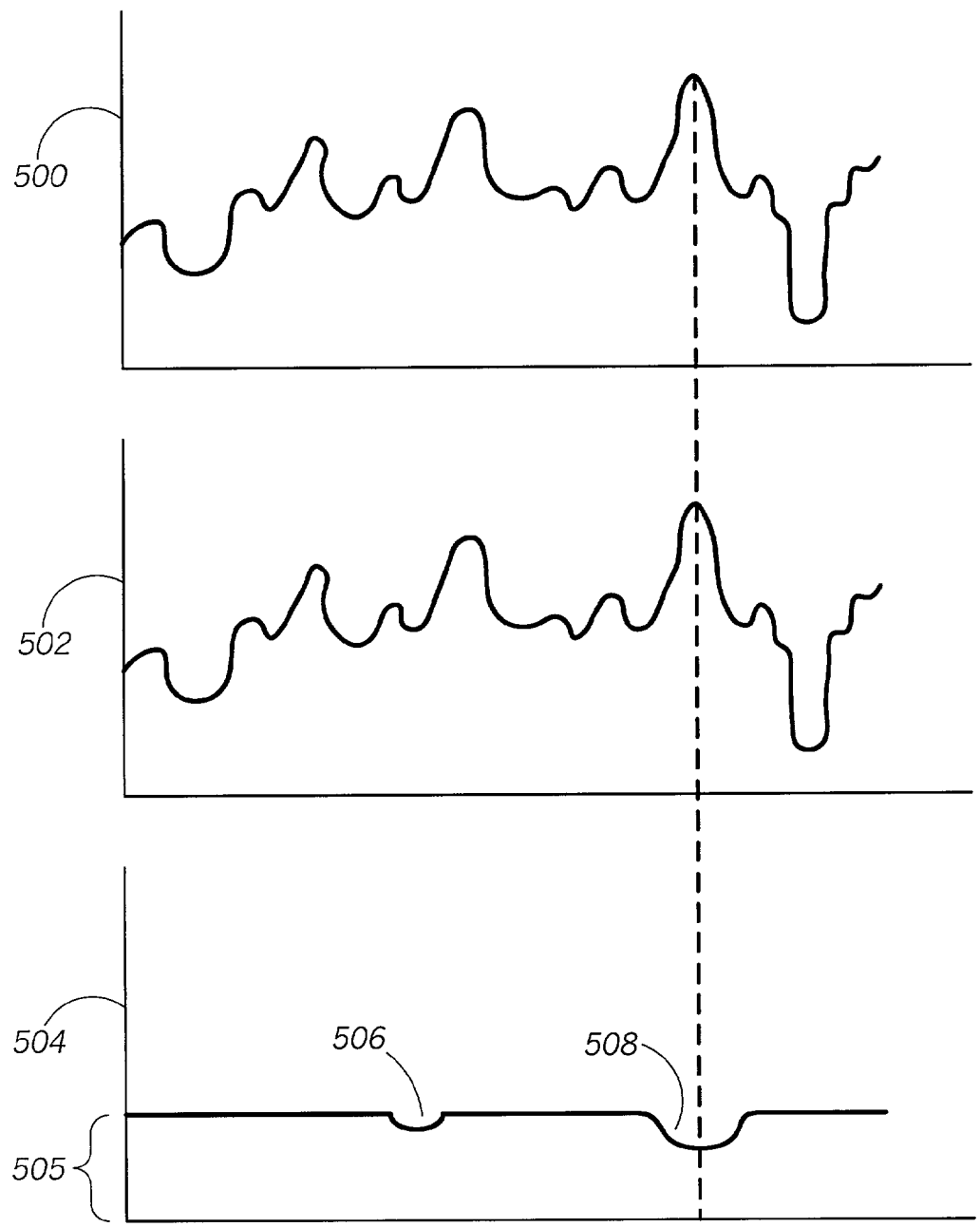
FIG. 5 shows a series of graph charts for illustrating detection of uncorrected compression in a signal to be transmitted.

Referring now to FIG. 5, there is shown a series of graph charts, showing a signal to be transmitted 500, the signal after amplification 502, and a graph 504 showing the ratio between the signals in 502 and 500. The method can equivalently be performed by determining the difference in magnitudes of the actual and expected signals. Normally the ratio is constant 505, but at some point the ratio may drop, such as at points 506 and 508. The ratio may also increase for similar reasons. The deviation from the constant ratio at these points indicates a deviation from an optimum compression level. To correct this and avoid distortion, the invention provides a method for optimizing supply modulation in the transmitter by providing a modulation signal to the power regulator that supplies the supply voltage to the RFPA. The modulation signal substantially corresponds to the envelope of the signal to be transmitted. Compression can be detected by comparing the magnitude of an amplified signal to be transmitted, after some amplification, modulation, or other operation of the transmitter on the signal with an expected magnitude, at some point in the transmitter. The modulation signal is adjusted in response to detecting a deviation of the magnitude of the amplified signal to be transmitted from the expected magnitude.

Thus, the invention corrects compression in a transmitter by comparing an actual signal with an expected signal at different points in the transmitter as the signal propagates through the transmitter. Deviation, or a tendency to deviate in the actual signal from the expected signal indicates a deviation from an optimum compression level. It will be understood by those skilled in the art that, while it is possible to detect compression by a ratio or a difference between signals at various points in the transmitter, in a control loop, depending on where compression is sensed, it may be likely that the tendency to deviate is detected, and the modulation signal adjusted to prevent a substantial difference from occurring, as would occur without adjustment of the modulation signal. When an intermediate amplifier is used, such as a baseband amplifier, compression deviation can avoided by sensing the difference between the amplified signal and the unamplified signal, or determining a ratio of the two signals, or both. A deviation from a constant ratio of a the signal at one point in the transmitter with the signal at another point in the transmitter indicates a deviation from an optimum compression level . It is also contemplated that deviation may occur in the reverse, which would result in what is known as expansion. Both compression and expansion can be reduced, if not substantially eliminated by the invention, thereby increasing the efficiency of the transmitter. Therefore the invention modifies the modulation signal in response to comparing the expected signal with the actual signal at some point in the transmitter, thereby optimizing the efficiency of the supply modulation scheme and avoiding unwanted compression distortion. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for optimizing supply modulation in a transmitter, comprising:
   providing a signal to be transmitted, the signal having an envelope;
   providing a modulation signal to a power regulator, the power regulator for providing a supply voltage to a radio frequency power amplifier (RFPA), the modulation signal substantially corresponding to the envelope of the signal to be transmitted;
   comparing an actual signal to be transmitted by the RFPA with an expected signal at a point in the transmitter wherein said expected signal is determined by calculation, or by mapping with a look-up table; and
   adjusting the modulation signal after said comparing step in response to detecting a deviation of the actual signal to be transmitted from the expected signal to maintain a desired compression level of the RFPA.

2. A method for optimizing supply modulation as defined in claim 1, further comprising linearizing the signal to be transmitted.

3. A method for optimizing supply modulation as defined in claim 2, wherein the linearizing comprises linearizing by cartesian feedback.

4. A method for optimizing supply modulation as defined in claim 3, wherein the comparing comprises comparing reference baseband signals with summed baseband signals.

5. A method for optimizing supply modulation as defined in claim 1, wherein the comparing comprises comparing a low level RF signal with an amplified RF signal at the input and output, respectively, of the RFPA.

6. A method for optimizing supply modulation as defined in claim 1, wherein the comparing is performed by a digital signal processor.

7. A transmitter for optimizing a supply modulation, comprising:
   a radio frequency power amplifier (RFPA) for amplifying a low level RF signal and providing an amplified RF signal;
   a power supply for providing power to the RFPA in correspondence with a modulation signal supplied to the power supply;
   a means for generating an envelope of a signal to be transmitted and providing the modulation signal to the power supply, the modulation signal substantially corresponding to the envelope of the signal to be transmitted; and
   a means for comparing an actual signal to be transmitted by the RFPA with an expected signal at a point in the transmitter wherein said expected signal is determined by calculation, or by mapping with a look-up table; and
   wherein the modulation signal after said comparing step is adjusted in response to detecting a deviation of the actual signal to be transmitted from the expected signal to maintain a desired compression level of the RFPA.

8. A transmitter for optimizing a supply modulation as defined in claim 7, further comprising means for linearizing the signal to be transmitted.

9. A transmitter for optimizing a supply modulation as defined in claim 8, wherein the means for linearizing comprises cartesian feedback.

10. A transmitter for optimizing a supply modulation as defined in claim 9, wherein the means for comparing compares reference baseband signals with summed baseband signals in the transmitter.

11. A transmitter for optimizing a supply modulation as defined in claim 7, wherein the means for comparing compares a low level RF signal with an amplified RF signal at the input and output, respectively, of the RFPA.

12. A transmitter for optimizing a supply modulation as defined in claim 7, wherein the means for comparing comprises a digital signal processor.

13. A method of modulating a supply voltage supplied to a radio frequency power amplifier (RFPA) in a transmitter, comprising:
   providing a signal to be transmitted, the signal having an envelope;
   providing a modulation signal to a power regulator, the power regulator for providing the supply voltage to said RFPA, the modulation signal substantially corresponding to the envelope of the signal to be transmitted; and adjusting the modulation signal after comparing an actual output signal of said RFPA with an expected signal wherein said expected signal is determined by calculation, or by mapping with a look-up table; to avoid excess gain compression at a gain stage of the transmitter, wherein adjusting the modulation signal deviates the modulation signal from autonomous correspondence with the envelope of the signal to be transmitted.

14. A method of modulating a supply voltage as defined in claim 13, further comprising linearizing the signal to be transmitted.

15. A method of modulating a supply voltage as defined in claim 14, wherein the linearizing comprises linearizing by cartesian feedback.

16. A method of modulating a supply voltage as defined in claim 15, wherein adjusting the modulation signal comprises comparing reference baseband signals with summed baseband signals.

17. A method of modulating a supply voltage as defined in claim 13, wherein adjusting the modulation signal comprises comparing a low level RF signal with an amplified RF signal at the input and output, respectively, of the RFPA.

18. A method of modulating a supply voltage as defined in claim 16, wherein the comparing is performed by a digital signal processor.

* * * * *